(12) United States Patent
Bourzeix

(10) Patent No.: US 6,393,071 B1
(45) Date of Patent: May 21, 2002

(54) CIRCUIT AND METHOD OF IDENTIFYING A BURST FREQUENCY

(75) Inventor: Francois Bourzeix, Toulouse (FR)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/232,004

(22) Filed: Jan. 15, 1999

(30) Foreign Application Priority Data

Jan. 15, 1998 (EP) ............................................. 98400064

(51) Int. Cl.⁷ .............................................. H04L 27/06
(52) U.S. Cl. ..................................................... 375/340
(58) Field of Search ............................... 375/340, 359, 375/366, 369, 316, 354

(56) References Cited

U.S. PATENT DOCUMENTS

| | | | |
|---|---|---|---|
| 3,676,593 A | * | 7/1972 | Muratani et al. ............ 370/215 |
| 4,642,685 A | * | 2/1987 | Roberts et al. ................ 725/11 |
| 4,910,470 A | | 3/1990 | Borth et al. ................... 331/12 |
| 5,187,719 A | * | 2/1993 | Birgenheier et al. ......... 375/226 |
| 5,289,391 A | * | 2/1994 | Ibrahim et al. ................ 702/74 |
| 5,313,501 A | * | 5/1994 | Thacker ....................... 375/369 |

FOREIGN PATENT DOCUMENTS

| | | | |
|---|---|---|---|
| EP | 0378405 | 7/1990 | ........... G01R/25/00 |
| WO | 9311605 | 6/1993 | ............ H03D/1/00 |

* cited by examiner

Primary Examiner—Tesfaldet Bocure

(57) ABSTRACT

A signal processor identifies a burst frequency in a communication channel. Buried in a multitude of RF transmitted incoming data is a sinusoidal burst frequency. The incoming data is stored, and the mean and variance of zero crossings of the incoming data is determined and an indicator is calculated. The indicator is compared to a threshold. When the indicator becomes greater than the threshold, then the burst frequency is identified. Next, the start of the burst frequency must be located. The mean and variance of the frequency of the burst signal is determined. The minimum variance is the start of the burst frequency. Other tests are performed to validate the burst frequency and minimize the probability of falsely identifying the burst frequency. The burst frequency is used to calibrate a crystal oscillator that controls the downconversion of the incoming data.

11 Claims, 3 Drawing Sheets

CIRCUIT AND METHOD OF IDENTIFYING A BURST FREQUENCY

BACKGROUND OF THE INVENTION

The present invention relates in general to communication systems and, more particularly, to a method of identifying a sinusoidal burst frequency in a communication channel.

Cellular and paging communication systems have become widespread in much of the industrialized world. Cellular communication principally involves voice communications between a mobile station and a base station. The base station interfaces through a switched telephone system to complete the call. Paging systems transfer data, e.g. phone numbers and other text, from a base station to the pager. The distinction between cellular phones and pagers is rapidly diminishing. Cellular phones now, or soon will be able to, receive digital data that can represent voice, text, faxes, phone number, etc. Pagers offering voice messaging can receive text as well as voice data and respond in kind.

Most, if not all, cellular and paging communication systems operate on a set of standards that regulate the transmission frequencies, protocols, and other communication specifications. In Europe for example, one telecommunication standard is known as Group System Mobile (GSM). The GSM network standard is available in other countries as well.

Under GSM, the base station transmits modulated radio frequency (RF) information at particular points in time. When a user switches on a mobile cellular phone to communicate with a base station, the mobile phone must establish a time synchronization with the base station to properly receive the information. The mobile phone has an internal frequency reference, typically a crystal oscillator, that varies with temperature, time, and environmental conditions. The crystal oscillator provides a reference frequency to one or more phase lock loops (PLL) that generate local oscillator frequencies to downconvert the received RF signal. The PLL local oscillator frequency must be precisely matched to accurately receive the modulated RF information.

DETAILED DESCRIPTION OF THE PREFERRED EMBODIMENT

Figure 1:
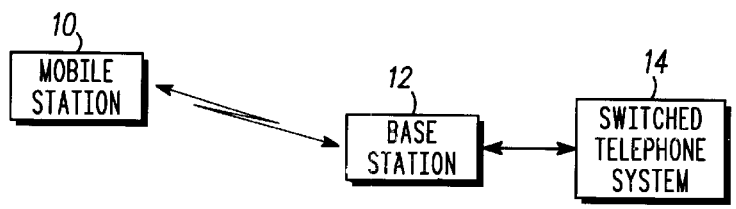
FIG. 1 illustrates a communication link between a mobile state and a base station.

Referring to FIG. 1, a mobile station 10, for example a cellular phone, pager, or other personal communicator, communicates with a base station 12. Base station 12 in turn interfaces with a switched telephone system 14. For example, mobile station 10 initiates a call, i.e. transmits a phone number, by way of an RF link to base station 12. Base station 12 passes the phone number to telephone system 14 to establish contact with the receiving party. The calling party communicates with the receiving party over the RF link. The communication can be voice in the context of a conventional phone call or data for a facsimile transmission. Alternately in a pager application, base station 12 sends a phone number, and possibly other data, to mobile station 10 for display.

Figure 2:
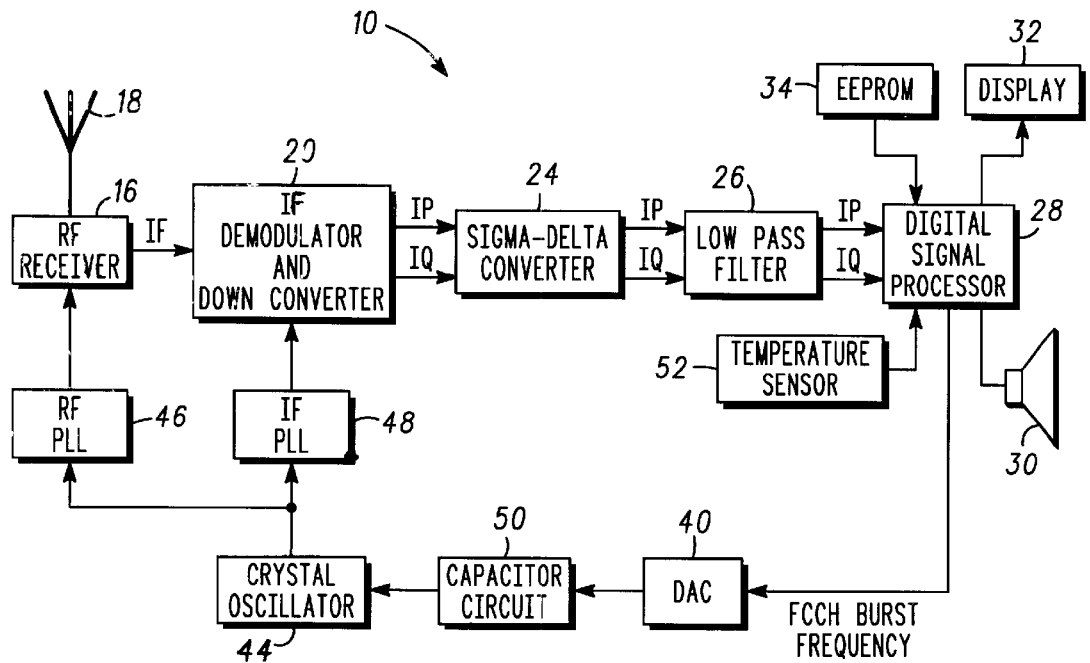
FIG. 2 is a block diagram illustrating the mobile station.

Turning to FIG. 2, further detail of mobile station 10 is shown including RF receiver 16 coupled to antenna 18 for receiving a transmitted RF signal operating at say 900 MHz. RF receiver 16 downconverts the RF signal to a 200 MHz IF signal. IF demodulator and downconverter block 20 downconverts and demodulates the IF signal to a baseband analog signal. The analog signal has in-phase (IP) and quadrature (IQ) components. Sigma-delta converter 24, or other suitable analog-digital converter (ADC), converts the IP and IQ analog signals to IP and IQ digital signals which are low-pass filtered in low pass filter (LPF) 26 and stored in digital signal processor (DSP) 28. The IP and IQ digital signals are processed through DSP 28 to drive speaker 30 to hear the voice, or to display data in display 32. The instructions (software code) used to control DSP 28 is stored in EEPROM 34 and downloaded as needed. FIG. 2 illustrates the receiver section of mobile station 10. Mobile station 10 may also include a transmitter section (not shown).

In the present example, the intercommunication between mobile station 10 and base station 12 is controlled by the GSM standard, although the present invention is applicable to other telecommunication standards. GSM is a communication system and protocol based on a FDMA/TDMA protocol (Frequency Division Multiplexed Access/Time Division Multiplexed Access). In GSM, each base station is allocated a list of frequencies on which it can establish communications with one or more mobile stations. Each frequency is time multiplexed (i.e. 8 distinct users can transmit on the same frequency). For each base station, one frequency is dedicated to exchange control information with the mobile stations located in its emission cell. This frequency is known as the beacon frequency. A pure phasor (sinusoidal) signal is transmitted by the base station on the beacon frequency every 46.15 ms with a duration of 577 microseconds. The pure phasor is very important since it lets the mobile station identify the beacon frequency. The frequency of the pure phasor is used to precisely tune the internal clock of mobile station 10, as discussed below.

Under GSM, mobile station 10 and base station 12 communicate over a frequency range, which is divided into channels. The frequency channels are transmitted in predefined time slots according to the GSM standard. The frequency channels include control, synchronization, and traffic (voice and data). The beacon frequency is transmitted over a number of predefined time slots, each about 5 milliseconds in duration. The beacon frequency includes a frequency connect channel (FCCH) burst that operates as a sinusoidal signal at 67.7 kHz sampled at 270 kHz, i.e. four samples per period.

As part of the present invention, DSP 28 monitors the different frequencies of the received baseband signal until it identifies the FCCH burst sequence. Once the FCCH burst is identified, DSP 28 routes an FCCH BURST FREQUENCY signal representative of the frequency of the FCCH burst to digital-analog converter (DAC) 40 where it is converted to an analog signal. Oscillator 44 uses a quartz crystal to generate a 13 MHz reference frequency. The reference frequency is applied to the reference clock input of RF PLL 46 to generate the local oscillator signal to downconvert the RF signal to the IF signal. The reference frequency is also applied to IF PLL 48 to downconvert the demodulated IF signal to baseband. The local oscillator frequency must be precisely matched to accurately downconvert the RF signal and the IF signal. The analog representation of the FCCH BURST FREQUENCY alters the voltage level on capacitor circuit 50, which in turn controls the frequency of crystal oscillator 44 to set the local oscillator frequency. Alternately, without DAC 40, capacitor circuit 50 may be implemented as a bank of capacitors which are switched in response to the digital FCCH BURST FREQUENCY signal to alter the operating frequency of the crystal oscillator. The control range of crystal oscillator 44 is 13 MHz±35 kHz in response to the FCCH BURST FREQUENCY.

DSP 28 operates under predefined instructions to execute the process disclosed below. The instructions are stored locally in EEPROM 34. EEPROM 34 also stores the initial value of the FCCH BURST FREQUENCY which controls crystal oscillator 44 until the FCCH burst is identified. As an additional feature, temperature sensor 52 provides a signal representing the present operating temperature of mobile station 10 as a factor of the FCCH BURST FREQUENCY.

The identification process involves several steps. First, DSP 28 must find the FCCH burst sequence in the beacon frequency channel. When the mobile station 10 powers-up and begins receiving the RF signals from base station 12, it does not know the location of the FCCH burst in the multitude of data it is receiving. Second, DSP 28 must precisely locate the beginning of the FCCH burst. Finally, the DSP tests the data identified as the FCCH burst to ensure that it is not a false detection. Once the process is complete, DSP 28 passes the FCCH BURST FREQUENCY, which is a digital signal representative of the frequency of the FCCH burst sequence, through DAC 40 to capacitor circuit 50 which in turn alters the output frequency of crystal oscillator 44 to calibrate the local oscillator frequencies in RF receiver 16 and IF demodulator and converter block 20 according to the FCCH burst.

Figure 3:
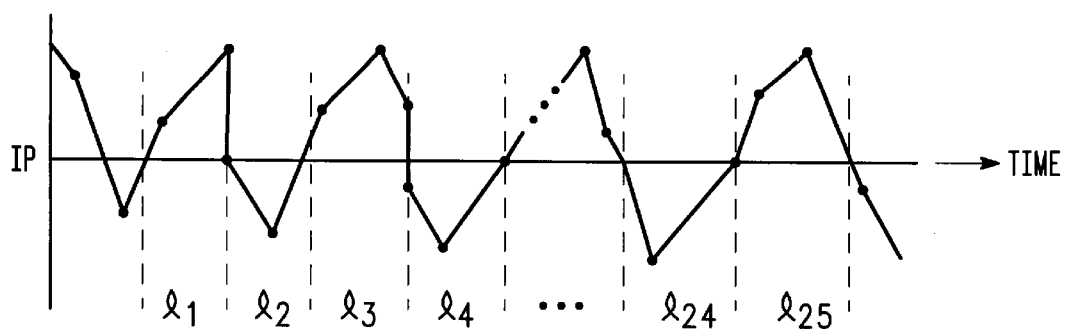
FIG. 3 is a waveform plot illustrating the baseband signal.

The waveform plot shown in FIG. 3 represents the IP digital data received from LPF 26. The waveform plot is representative of the desired FCCH burst. The beacon frequency channel transmits signals other than the FCCH burst. The other signals on the beacon frequency channel are frequency variant and therefore not the burst sequence being sought. The IP and IQ digital data are stored locally in a buffer of DSP 28 or other suitable local storage, e.g. external RAM. Although only the IP processing is discussed in detail, the steps described below are performed on both the IP and IQ digital data.

DSP 28 stores 500 or more samples of the IP and IQ digital data. The samples have positive and negative values. In the sample period, first determine the length of time between consecutive zero crossings of the IP sampled data, i.e. time periods $l_1$, $l_2$, $l_3$, $l_4$, Ö, $l_n$. The arithmetic mean of the time periods is given as $l = (l_1+l_2+l_3+l_4+\ddot{O}+l_n)/n$, where n is the number of time periods. The present example uses 25 time periods (50 sample points) of the IP sampled data. The first order variance VIP of the time periods ln is determined as $VIP = |l-l_1|+|l-l_2|+|l-l_3|+|l-l_4|+\ddot{O}+|l-l_{25}|$, where |x| represents the absolute value of "x". The same calculation is also performed for the first order variance $V_{IQ}$ of the IQ sampled data. An indicator G is calculated as $G = N_{IP}+N_{IQ}-(V_{IP}+V_{IQ})$, where $N_{IP}$ is the number of zero crossings in the IP sampled data and $N_{IQ}$ is the number of zero crossings in the IQ sampled data. In the present example, assume $N_{IP}=N_{IQ}=25$.

For additional accuracy, the indicator G can be calculated for subsequent sample periods. For example, indicator G1 is calculated for a first group of 50 sample points, indicator G2 is calculated for a second group of 50 sample points, and indicator G3 is calculated for a third group of 50 sample points. The indicator G then becomes G1+G2+G3.

If the sampled data is sinusoidal then the period between consecutive zero crossings is substantially constant over the sample period. The individual time periods $l_1$, $l_2$, $l_3$, $l_4$, Ö, $l_n$ are about the same and equal to the mean time period 1. The first order variances $V_{IP}$ and $V_{IQ}$ are smaller when the sampled data is sinusoidal and larger when the sampled data is frequency variant. A typical value for $V_{IP}$ or $V_{IQ}$ is about 150 if the sample period is non-sinusoidal and about 50 if the sample period is sinusoidal. Therefore, the indicator G is smaller when the sampled data is sinusoidal and larger when the sampled data is frequency variant. The indicator G is compared to a threshold, e.g. zero for G=G1+G2+G3. If the indicator G is less than the threshold, then the sampled data is declared frequency variant, i.e. not the FCCH burst sequence. The search continues for the desired FCCH burst as more data is received from base station 12, downconverted, demodulated, and loaded into the buffer of DSP 28. If the indicator G exceeds the threshold, then the sampled data is declared sinusoidal and the FCCH burst is identified.

The next phase of the calibration process involves localizing the start of the FCCH burst sequence. Using the IP and IQ sampled data stored in the local memory of DSP 28, the process controls a sliding window that moves across the stored sample data. For the present example, the sliding window is 8 data points in width. For the IP sampled data, the sliding window starts at x(1), x(2), x(3), x(4), x(5), x(6), x(7), and x(8). For the IQ sampled data, the sliding window is given as y(1), y(2), y(3), y(4), y(5), y(6), y(7), and y(8). A complex number z(k) is formed by z(k)=x(k)+jy(k), where j is $\sqrt{-1}$ and k=1, 8. The complex number z(k) can be represented in polar form with a magnitude and angle. The complex phasor rotates by multiplying the complex number z(k) by an exponential as follows:

$$\hat{z}(k) = z(k) * \exp(-j2\pi(k/4)) \qquad (1)$$

For k=1, 8, equation (1) yields values $\hat{z}(1)$, $\hat{z}(2)$, $\hat{z}(3)$, $\hat{z}(4)$, $\hat{z}(5)$, $\hat{z}(6)$, $\hat{z}(7)$, and $\hat{z}(8)$. An angle θ representing an estimate of the burst frequency is calculated by equation (2):

$$\theta = \arg\{\text{conj}.[(\hat{z}(k)+\hat{z}(k+1(k+2)+\hat{z}(k+3))*(\hat{z}(k+4)+\hat{z}(k+5)+\hat{z}(k+6)+\hat{z}(k+7))]\}/4 \qquad (2)$$

where arg is the angle in polar form, and conj is the complex conjugate. For the first 8 sampled data points, k=1.

The angle $\theta_1$ is calculated for x(1)Öx(8) and y(1)Öy(8). The window shifts, for example, by four and the angle $\theta_2$ is calculated for x(5)Öx(12) and y(5)Öy(12) using equation (1) with k=5, 12 and equation (2) with k=5. The window again shifts by four and the angle $\theta_3$ is calculated for x(9)Öx(16) and y(9)Oy(16) using equation (1) with k=9, 16 and equation (2) with k=9. The process continues, each time shifting the window by four, until angle $\theta_{124}$ is calculated for x(493) Öx(500) and y(493)Öy(500). The angles $\theta_1\ddot{O}\theta_{124}$ are shown in the upper waveform plot of FIG. 4.

The mean of a first set of angles $\theta_1\ddot{O}\theta_{36}$ is given in equation (3):

$$\theta_{mean1} = \left(\sum_{i=1}^{36} \theta_i\right) \Big/ 36 \qquad (3)$$

The first order variance for the first set of angles $\theta_1 \ddot{O} \theta_{36}$ is given in equation (4):

$$V_{\theta 1} = \sum_{i=1}^{36} |\theta_{mean1} - \theta_i| \qquad (4)$$

Figure 4:
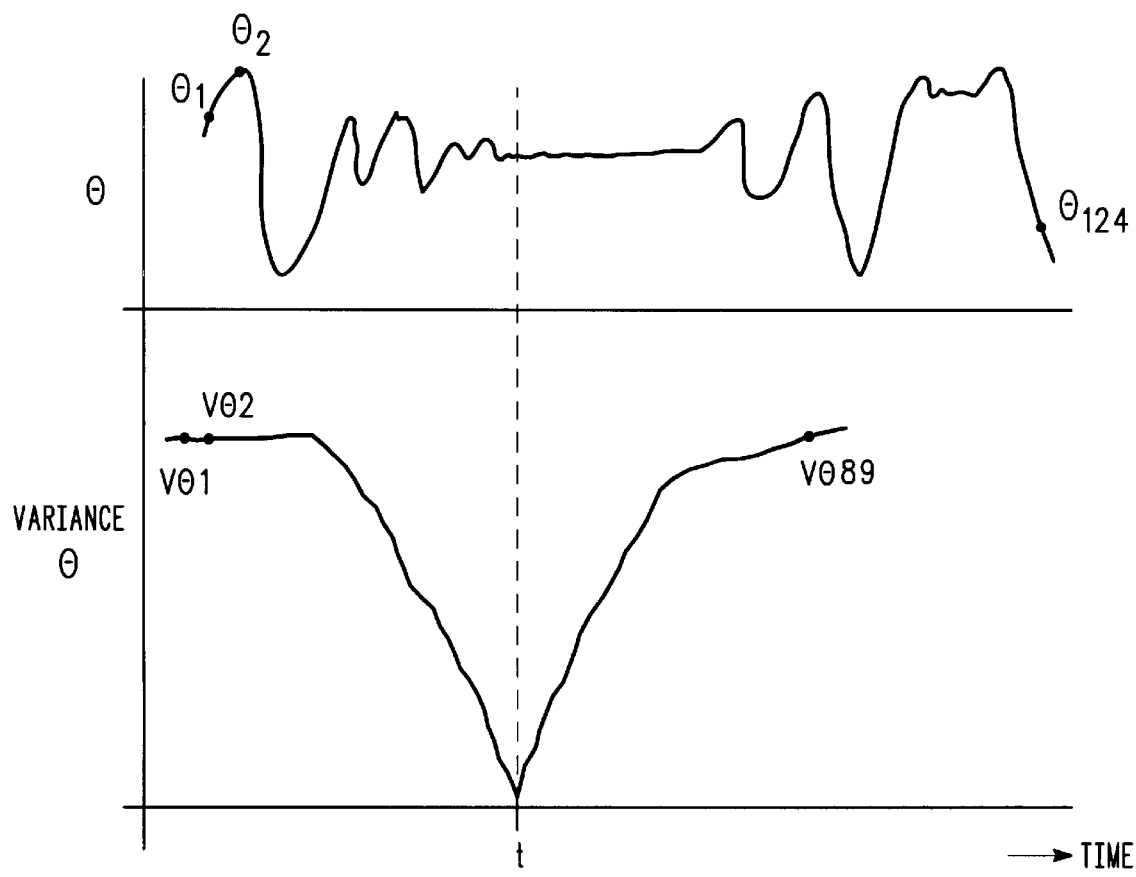
FIG. 4 is a waveform plot illustrating the frequency of the burst and the variance of the frequency.

The first order variance $V_{74\ 1}$ of the first set of angles $\theta 1 \ddot{O} \theta_{36}$ is a first data point in the lower waveform plot of FIG. 4.

The mean of a second set of angles $\theta_2 \ddot{O} \theta_{37}$ is given in equation (5):

$$\theta_{mean2} = \left(\sum_{i=2}^{37} \theta_i\right) \Big/ 36 \qquad (5)$$

The first order variance for the second set of angles $\theta_2 \ddot{O} \theta_{37}$ is given in equation (6):

$$V_{\theta 2} = \sum_{i=2}^{37} |\theta_{mean2} - \theta_i| \qquad (6)$$

The first order variance $V_{\theta 2}$ of the second set of angles $\theta_2 \ddot{O} \theta_{37}$ is a second data point in FIG. 4.

The process continues, each time shifting the calculation of the mean angle $\theta_{mean}$ and variance $V_\theta$ by one to determine another data point in the lower waveform plot of FIG. 4.

The mean of a last set of angles $\theta_{89} \ddot{O} \theta_{124}$ is given in equation (7):

$$\theta_{mean89} = \left(\sum_{i=89}^{124} \theta_i\right) \Big/ 36 \qquad (7)$$

The first order variance for the second set of angles $\theta_{89} \ddot{O} \theta_{124}$ is given in equation (8):

$$V_{\theta 89} = \sum_{i=89}^{124} |\theta_{mean89} - \theta_i| \qquad (8)$$

The first order variance $V_{\theta 89}$ is the last data point in FIG. 4. The combination of $V_{\theta 1} \ddot{O} V_{\theta 89}$ defines the lower waveform plot of FIG. 4. The minimum first order variance $V_\theta$ is the start of the FCCH burst, which occurs at time t. Notice that the angle $\theta$ representing an estimate of the burst frequency is variable before time t because the beacon frequency channel is frequency variant before time t, i.e. when the FCCH burst is not yet present. After time t, the FCCH burst begins and the angle $\theta$ becomes substantially constant which is a characteristic of a sinusoidal signal. The first order variance decreases as the beacon frequency channel decreases its variation and becomes constant. The minimum first order variance coincides with the beginning of a constant angle $\theta$ because the sample frequencies within the sample period to the right of time t are all within the FCCH burst and therefore are substantially constant. The first order variance increases after the minimum because the variance calculation includes frequency variant values of angle $\theta 0$ occurring after the FCCH burst. The frequency of the FCCH burst sequence is substantially constant, i.e. $\theta_t \grave{o} \theta_{t+1} \grave{o} \theta_{t+2} \ddot{O} \grave{o} \theta_{t+148}$, where $\theta_t$ is the angle at time t. The frequency of the FCCH burst sequence can be set equal to $\theta_t$, or taken as an average of some number of angles $\theta$ in the FCCH burst sequence.

Now that the FCCH burst sequence, and its starting location, has been identified, a validation sequence is performed through a series of tests to ensure that the identified burst is indeed an FCCH burst. The validation tests increase the confidence in the FCCH burst and reduce the probability of falsely identifying other portions of the beacon frequency channel as the FCCH burst.

The valid FCCH burst lasts as a pure sinusoidal signal for 148 samples. Also transmitted in the beacon frequency channel are ìnormalî bursts which include a sinusoidal portion and a non-sinusoidal portion. The non-sinusoidal portion, commonly referred to as a training sequence, is typically sandwiched between the sinusoidal portions of the ìnormalî burst. For example, the normal burst may transmit 61 encrypted bits (sinusoidal), 26 training sequence bits (non-sinusoidal), and 61 more encrypted bits (sinusoidal) for a total of 148 bits. The validation test checks for presence of such a training sequence and rejects the burst if it exhibits non-FCCH burst characteristics. A normal burst should not be used to calibrate crystal oscillator 44.

As a first test, an indicator $G_{test1}$ for the burst under test is calculated as described above on 50 data samples in the beginning of the sample period, e.g. between samples 1 and 50. Another indicator $G_{test2}$ is calculated for the burst under test as described above on 50 data samples including samples that are likely located on the training sequence, e.g. samples 60–109. The indicator $G_{test1}$ is compared with indicator $G_{test2}$. If $G_{test1} \grave{o} G_{test2}$ then proceed to test 2. Otherwise, the burst under test is rejected as a false identification of an FCCH burst.

As a second test, a variance $V_{\theta test}$ is calculated for the burst under test as described above. The variance $V_{\theta test}$ is compared to thresholds $V_1 < V_2$. If $V_{\theta test} > V_2$, then reject the burst under test as an FCCH burst. The burst under test is not used to determine the FCCH BURST FREQUENCY. If $V_{\theta test} < V_1$, then confirm the burst under test as an FCCH burst. If $V_1 < V_{74\ test} < V_2$, then proceed to test 3.

As a third test, the slope of the variance $V_\theta$ is calculated using a linear regression algorithm for the burst under test. An FCCH burst has a ìVî shaped curve with a negative slope $S_1$ and a positive slope $S_2$. If $S_1$ is in the range $(-S_{MAX}, -S_{MIN})$ and $S_2$ is in the range $(S_{MAX}, S_{MIN})$, then the burst under test is confirmed as an FCCH burst. If the slopes $S_1$ or $S_2$ are inferior to a lower threshold $S_{REJ}$, then the burst under test is rejected as an FCCH burst. The burst under test is not used to determine the FCCH BURST FREQUENCY. Otherwise proceed to step 4.

As a fourth test, the indicator $G = G1 + G2 + G3$ is calculated for three consecutive sets of 50 sample periods of the burst under test. If the indicator G of the burst under test is less than a threshold $G_{MAX}$, then the testing period fails the fourth test. The burst under test is not used to determine the FCCH BURST FREQUENCY. If the indicator G of the burst under test is greater than $G_{MAX}$, then the burst under test is confirmed as an FCCH burst. DSP 28 passes the FCCH BURST FREQUENCY based on the FCCH burst to calibrate crystal oscillator 44.

Figure 5:
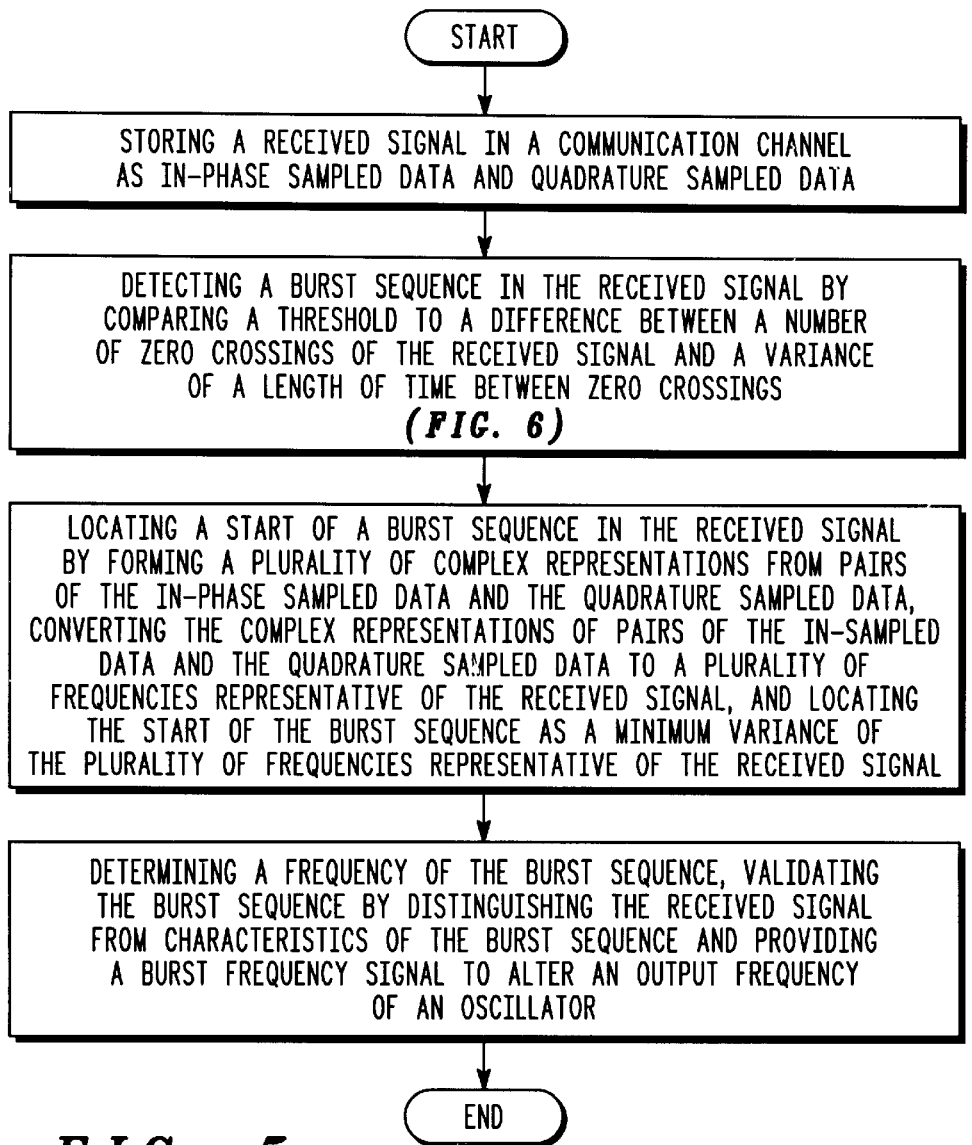
FIG. 5 is a flowchart of the method of identifying a burst frequency in accordance with the present invention.

In FIG. 5, a received signal is stored in a communication channel as in-phase sampled data and quadrature sampled data. A burst sequence is detected in the received signal by comparing a threshold to a difference between a number of zero crossings of the received signal and a variance of a length of time between zero crossings. A start of a burst sequence in the received signal is located by forming a plurality of complex representations from pairs of the in-phase sampled data and the quadrature sampled data. The complex representations of pairs of the in-sampled data and the quadrature sampled data are converted to a plurality of frequencies representative of the received signal. The start of the burst sequence is located as a minimum variance of the plurality of frequencies representative of the received signal. A frequency of the burst sequence is determined. The burst sequence is validated by distinguishing the received signal from characteristics of the burst sequence. A burst frequency signal is provided to alter an output frequency of an oscillator.

Figure 6:
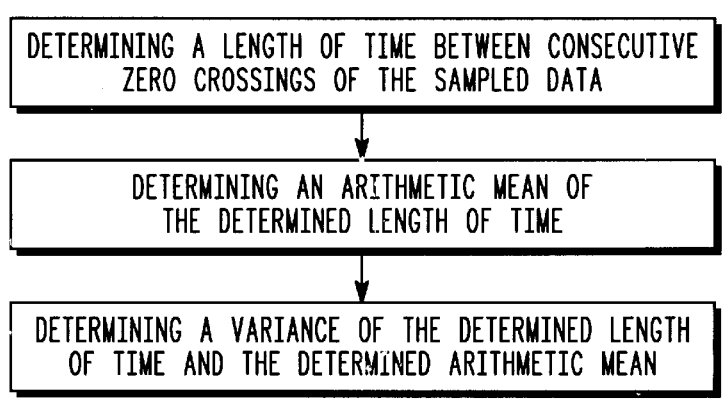
FIG. 6 is a flowchart further detailing a flow of the burst sequence detection.

Illustrated in FIG. 6 is an exemplary flow of the burst sequence detection of FIG. 5. A length of time between consecutive zero crossings of the sampled data is determined. An arithmetic mean of the determined length of time is determined. A variance of the determined length of time and the determined arithmetic mean is determined.

In summary, the present invention provides a method of identifying a burst frequency in a communication channel. Buried somewhere in a multitude of RF transmitted incoming data is a sinusoidal burst frequency. The incoming data is stored, and the mean and variance of zero crossings of the incoming data is determined and an indicator is calculated. The more evenly spaced the zero crossings, i.e. characteristic of a sinusoidal signal, the greater the indicator. The indicator is compared to a threshold. When the indicator becomes greater than the threshold, then the burst frequency is identified. Next, the start of the burst frequency must be located. The mean and variance of the frequency of the burst signal is determined. The minimum variance is the start of the burst frequency. Other tests are performed to validate the burst frequency and minimize the probability of falsely identifying the burst frequency. The burst frequency is used to calibrate a crystal oscillator that controls the downconversion of the incoming data.

What is claimed is:

1. A method of identifying a burst sequence in a received signal in a communication channel, comprising the steps of:
   detecting the burst sequence in the communication channel by comparing a threshold to a difference between a number of zero crossings of the received signal and a variance of a length of time between zero crossings; and
   locating a start of the burst sequence in the communication channel.

2. The method of claim 1 wherein the step of detecting the burst sequence includes the steps of:
   storing the received signal as sampled data;
   determining a length of time between consecutive zero crossings of the sampled data;
   determining an arithmetic mean of the length of time between consecutive zero crossings of the sampled data; and
   determining a variance of the length of time between consecutive zero crossings of the sampled data from the length of time between consecutive zero crossings of the sampled data and the arithmetic mean of the length of time between consecutive zero crossings of the sampled data.

3. The method of claim 1 wherein the step of locating a start of the burst sequence includes the steps of:
   storing the received signal as in-phase sampled data and quadrature sampled data;
   forming a plurality of complex representations from pairs of the in-phase sampled data and the quadrature sampled data;
   converting the complex representations of pairs of the in-phase sampled data and the quadrature sampled data to a plurality of frequencies representative of the received signal; and
   locating the start of the burst sequence as a minimum variance of the plurality of frequencies representative of the received signal.

4. The method of claim 3 further comprising the steps of:
   determining a frequency of the burst sequence; and
   providing a burst frequency signal representative of the frequency of the burst sequence to alter an output frequency of an oscillator.

5. The method of claim 4 further including the step of validating the burst sequence by distinguishing the received signal from characteristics of the burst sequence.

6. A signal processor for identifying a burst sequence in a received signal in a communication channel, comprising:
   means for detecting the burst sequence in the communication channel by comparing a threshold to a difference between a number of zero crossings of the received signal and a variance of a length of time between zero crossings; and
   means for locating a start of the burst sequence in the communication channel.

7. The signal processor of claim 6 further comprising:
   means for storing the received signal as sampled data;
   means for determining a length of time between consecutive zero crossings of the sampled data;
   means for determining an arithmetic mean of the length of time between consecutive zero crossings of the sampled data; and
   means for determining a variance of the length of time between consecutive zero crossings of the sampled data from the length of time between consecutive zero crossings of the sampled data and the arithmetic mean of the length of time between consecutive zero crossings of the sampled data.

8. The signal processor of claim 6 further comprising:
   means for storing the received signal as in-phase sampled data and quadrature sampled data;
   means for forming a plurality of complex representations from pairs of the in-phase sampled data and the quadrature sampled data;
   means for converting the complex representations of pairs of the in-phase sampled data and the quadrature sampled data to a plurality of frequencies representative of the received signal; and
   means for locating the start of the burst sequence as a minimum variance of the plurality of frequencies representative of the received signal.

9. A wireless communication system, comprising:
   an RF receiver having an input coupled for receiving an RF signal and downconverting the RF signal to baseband data;
   an oscillator coupled for receiving a burst frequency signal which controls a frequency of an oscillator signal which is applied to a reference frequency input of the RF receiver for downconverting the RF signal; and
   a signal processor coupled for receiving the baseband data and detecting a burst sequence in the baseband data by comparing a threshold to a difference between a number of zero crossings of the baseband data and a variance of a length of time between zero crossings, the signal processor further locating a start of the burst sequence and providing the burst frequency signal representative of the frequency of the burst sequence to the oscillator.

10. The wireless communication system of claim 9 wherein the signal processor further includes:

means for storing the baseband data as sampled data;

means for determining a length of time between consecutive zero crossings of the sampled data;

means for determining an arithmetic mean of the length of time between consecutive zero crossings of the sampled data; and means for determining a variance of the length of time between consecutive zero crossings of the sampled data from the length of time between consecutive zero crossings of the sampled data and the arithmetic mean of the length of time between consecutive zero crossings of the sampled data.

11. The wireless communication system of claim 9 wherein the signal processor further includes:

means for storing the baseband data as in-phase sampled data and quadrature sampled data;

means for forming a plurality of complex representations from pairs of the in-phase sampled data and the quadrature sampled data;

means for converting the complex representations of pairs of the in-phase sampled data and the quadrature sampled data to a plurality of frequencies representative of the baseband data; and means for locating the start of the burst sequence as a minimum variance of the plurality of frequencies representative of the baseband data.

* * * * *